US011422203B1

(12) United States Patent
Leake et al.

(10) Patent No.: US 11,422,203 B1
(45) Date of Patent: Aug. 23, 2022

(54) CURRENT SENSING LINE FAULT DETECTOR

(71) Applicant: Maxim Integrated Products, Inc., San Jose, CA (US)

(72) Inventors: William W. Leake, Colorado Springs, CO (US); Caglar Yilmazer, Istanbul (TR)

(73) Assignee: Maxim Integrated Products, Inc., San Jose, CA (US)

( * ) Notice: Subject to any disclaimer, the term of this patent is extended or adjusted under 35 U.S.C. 154(b) by 46 days.

(21) Appl. No.: 16/789,193

(22) Filed: Feb. 12, 2020

Related U.S. Application Data

(60) Provisional application No. 62/806,738, filed on Feb. 15, 2019.

(51) Int. Cl.
*G01R 31/58* (2020.01)

(52) U.S. Cl.
CPC .................................. *G01R 31/58* (2020.01)

(58) Field of Classification Search
CPC ...... G01R 31/00; G01R 31/08; G01R 31/081; G01R 31/083; G01R 31/085; G01R 31/086; G01R 31/50; G01R 31/55; G01R 31/6658; G01R 19/0092; H04B 3/00; H04B 3/02; H04B 3/46
See application file for complete search history.

(56) References Cited

U.S. PATENT DOCUMENTS

| 5,770,956 | A | * | 6/1998 | Rolff | G01R 19/0092 |
| | | | | | 327/101 |
| 10,528,324 | B2 | * | 1/2020 | Stiurca | H03K 17/687 |
| 2002/0105982 | A1 | * | 8/2002 | Chin | H01S 5/042 |
| | | | | | 372/38.02 |
| 2006/0113976 | A1 | * | 6/2006 | Bernardon | H02M 3/156 |
| | | | | | 323/282 |
| 2009/0079415 | A1 | * | 3/2009 | Amada | G01R 31/44 |
| | | | | | 324/76.11 |

(Continued)

FOREIGN PATENT DOCUMENTS

| AT | 521604 B1 * 3/2020 | ............. H02H 7/228 |
| CN | 101782621 B * 12/2012 | |

(Continued)

*Primary Examiner* — Patrick Assouad
*Assistant Examiner* — Demetrius R Pretlow
(74) *Attorney, Agent, or Firm* — TIPS Group

(57) ABSTRACT

A current sensing line fault detector includes a unity gain buffer coupling a reference voltage to an IC pin, a current controlled current source coupled to the buffer, a current mode A/D converter developing a digital signal representative of the IC pin current, and logic for determining the state of a transmission line coupled to the IC pin. An alternative current sensing line fault detector includes an OPAMP having a first input coupled to an input node and to a reference current source and having a second input coupled to a reference voltage source. A voltage controlled current source (VCCS) is coupled between the first input of the OPAMP and ground and is controlled by an output of the OPAMP. An A/D converter is coupled to the output of the OPAMP to develop a digital output signal representative of the current flowing through the current sensor.

23 Claims, 2 Drawing Sheets

(56) References Cited

U.S. PATENT DOCUMENTS

| | | | |
|---|---|---|---|
| 2009/0121729 A1* | 5/2009 | Farkas | G01R 19/0092 324/713 |
| 2011/0115472 A1* | 5/2011 | Lin | G01R 19/0092 324/123 R |
| 2012/0001678 A1* | 1/2012 | Feng | H03K 17/962 327/517 |
| 2012/0268075 A1* | 10/2012 | Wolf | G01R 19/0092 320/132 |
| 2014/0077830 A1* | 3/2014 | Veselic | G01R 31/50 324/750.09 |
| 2014/0111248 A1* | 4/2014 | Kumar | H03K 5/24 327/97 |
| 2015/0137820 A1* | 5/2015 | Mikuteit | G01R 15/09 324/426 |
| 2015/0233996 A1* | 8/2015 | Yoon | G01R 31/52 324/509 |
| 2015/0381113 A1* | 12/2015 | Price | H03F 1/0205 324/123 R |
| 2016/0181906 A1* | 6/2016 | Gambetta | H02M 1/08 323/288 |
| 2017/0063228 A1* | 3/2017 | Kimura | G01R 19/0092 |
| 2017/0108542 A1* | 4/2017 | Gubba Ravikumar | G01R 31/54 |
| 2018/0109187 A1* | 4/2018 | Eggermont | H02M 3/158 |
| 2018/0294643 A1* | 10/2018 | Donath | H02H 3/0935 |
| 2019/0346528 A1* | 11/2019 | Dang | G01R 19/0092 |
| 2019/0353715 A1* | 11/2019 | Miki | H02M 1/32 |
| 2020/0059212 A1* | 2/2020 | Raimar | H03G 3/30 |
| 2020/0127564 A1* | 4/2020 | Zhao | G01R 19/0092 |
| 2021/0270911 A1* | 9/2021 | Kageyama | H02H 7/0838 |

FOREIGN PATENT DOCUMENTS

| | | | | |
|---|---|---|---|---|
| CN | 103701387 B | * | 1/2017 | |
| CN | 110673047 A | * | 1/2020 | H01M 10/4285 |
| CN | 112904236 A | * | 6/2021 | |
| JP | H11239233 A | * | 8/1999 | |
| KR | 20020058296 A | * | 7/2002 | H01M 10/4285 |
| KR | 20080034765 A | * | 4/2008 | |
| KR | 101581191 B1 | * | 12/2015 | G01R 1/36 |
| WO | WO-2004088338 A1 | * | 10/2004 | H02H 7/228 |
| WO | WO-2011097368 A1 | * | 8/2011 | G01R 1/36 |

\* cited by examiner

CURRENT SENSING LINE FAULT DETECTOR

CROSS REFERENCE TO RELATED APPLICATION(S)

This application claims the benefit of U.S. Ser. No. 62/806,738, filed Feb. 15, 2019, incorporated herein by reference.

BACKGROUND

Automobiles use serial cables ("transmission lines") to multiplex parallel video to and from camera sources and display destinations within a vehicle ("automotive systems"). With such automotive systems, typically an integrated circuit (IC) and discrete components are used to alternating current (AC) couple high speed serial data through board-mounted capacitors onto a transmission line (e.g. a differential twisted pair or single ended coaxial cable). The other end of the line is also typically AC coupled. The otherwise floating direct current (DC) bias of the transmission line can be biased by resistors on either end of the line. Sense lines sense the voltage on the line through a resistor network and will change when the transmission line is shorted to GND, shorted to battery, or is disconnected from the IC (open condition) due to a fault in the system. On-chip comparators compare the sensed input voltage to different references voltages. From the status of the comparator outputs, logic can be used to detect one or more conditions, e.g. normal, short-to-ground, short-to-battery, or open.

While useful, prior art voltage-based fault detection has its limitations. For example, they do not address the problem of detecting line-to-line shorts in twisted pair transmission lines. They also require additional voltage supplies and additional external resistors. An external supply is also not desirable because one must take its variation into account for accuracy. Also, short-to-battery detection in prior art fault detectors can require clamping diodes to prevent IC pins from exceeding supply voltages, thereby creating reliability problems. These clamping diodes need to have a high current capacity, which adds area and cost to the production of the IC. Since electric car battery voltages increase to as much as 48V, this current can become excessive and clamping to a low pin voltage tends to become even more difficult and expensive.

These and other limitations of the prior art will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Various example embodiments of line fault detectors are described herein which operate by sensing current instead of voltage to detect fault conditions, e.g. normal, short-to-ground, short-to-battery, or open. In certain example embodiments, line-to-line shorts, e.g. in differential or "twisted pair" transmission lines, can also be detected.

Figure 1:
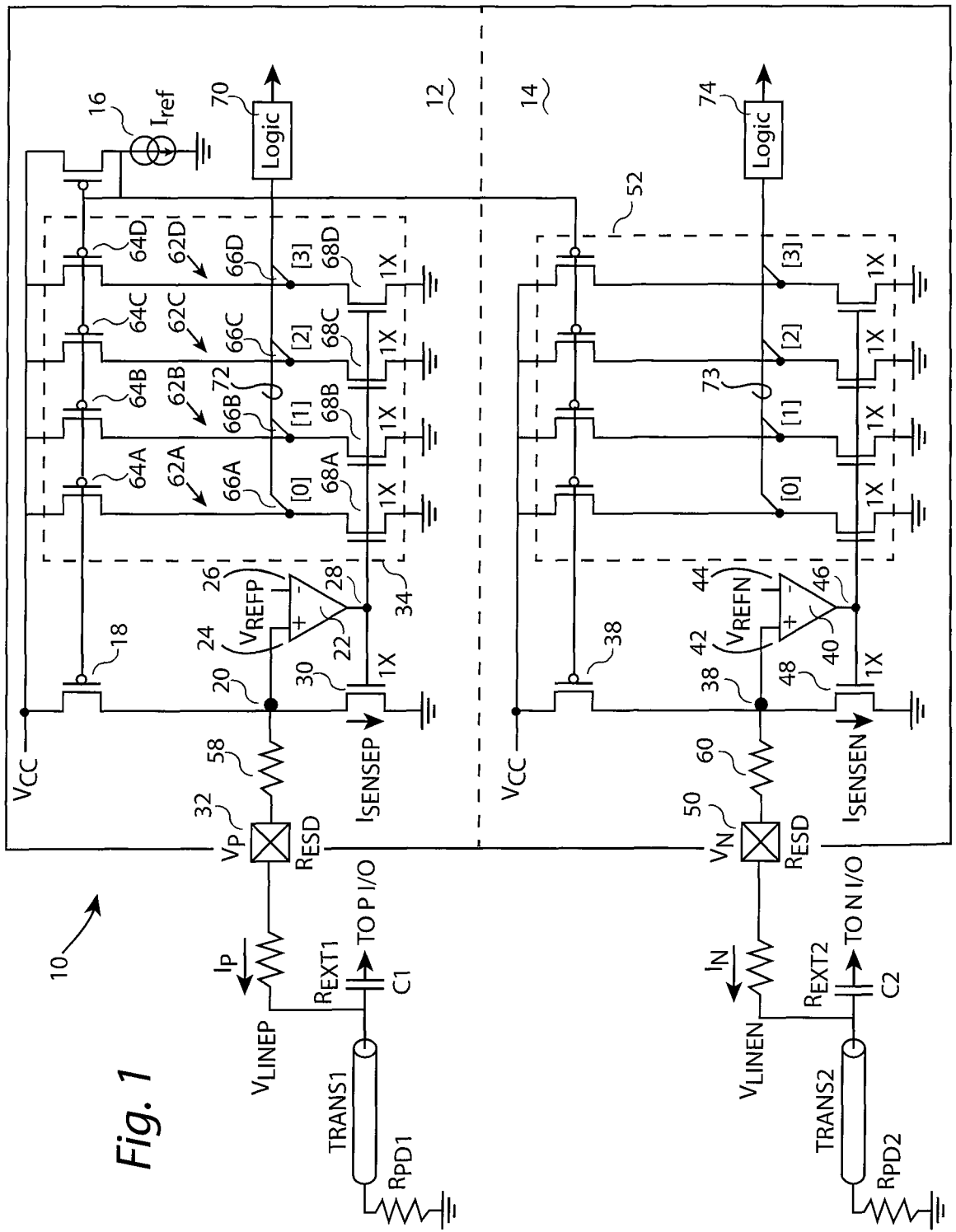
FIG. 1 is a schematic diagram of a first example current sensing line fault detector.

In FIG. 1, an embodiment, set forth by way of example and not limitation, of a current sensing fault detector system 10 includes a first line fault detector 12 and a second line fault detector 14. It should be noted that either of the first line fault detector 12 and the second line fault detector 14 can independently detect a number of states of a transmission line e.g. normal, short-to-ground, short-to-battery, or open. Therefore, for a coaxial cable, one line fault detector is sufficient. However, for differential or "twisted pair" transmission lines, the addition of a second line fault detector also allows for the detection of shorted-differential-pairs can be determined. This is accomplished by provided different sensing currents for each wire of the differential pair. When used for twisted pair transmission lines, the first line fault detector 12 may be referred to as the "Positive" or "P" line circuit and the second line fault detector 14 may be referred to as the "Negative" or "N" line circuit.

Also shown in FIG. 1 are sample external components such as external resistor REXT1 and REXT2, transmission lines TRANS1 and TRANS2, terminating resistors RPD1 and RPD2, and capacitors C1 and C2. The fault detector 10 is typically implemented as an integrated circuit (IC), while the external components typically being provided by the customer.

The example first line fault detector 12 includes a reference current source 16 coupled between a voltage source and ground and a first reference current mirror 18 coupled to the reference current source 16, where the first reference current mirror 18 is coupled to a voltage source Vcc and has a current node 20. A first operational amplifier (OPAMP) 22 has a first input 24 coupled to the current node 20, a second input 26 coupled to a reference voltage $V_{REFP}$, and an output 28. A first sensing current mirror 30 is coupled to the output 28 of OPAMP 22 and is coupled between the current node 20 and ground. In this example, the first sensing current mirror 30 is a single MOSFET transistor having its gate coupled to the output of OPAMP 22 and operates as a voltage controlled current source (VCCS) to provide feedback to the OPAMP 22 to hold the first input 24, and hence a first integrated circuit (IC) pin 32 coupled to the current node 20, to $V_{REFP}$. As is well known to those of skill in the art, an IC is typically provided with a package with a number of pins (alternatively referred to as leads, contacts, etc.) to permit the circuitry within the package to communicate with external components. A first current-mode analog-to-digital (A/D) converter 34 is coupled to the output 28 of the first operational amplifier to develop a first digital output signal representative of the current flowing through the first sensing current mirror 30.

The example second line fault detector 14 includes a second reference current mirror 36 coupled to the reference current source 16, where the second reference current mirror 36 is coupled to a voltage source Vcc and to a current node 38. A second operational amplifier (OPAMP) 40 has a first input 42 coupled to the current node 38, a second input 44 coupled to a reference voltage $V_{REFN}$, and an output 46. A second sensing current mirror 48 is coupled to the output 46 of the second operational amplifier 40 and is coupled between the current node 38 and ground. In this example, the second sensing current mirror 48 is a single MOSFET transistor having its gate coupled to the output of OPAMP 40 and operates as a voltage controlled current source (VCCS) to provide feedback to the OPAMP 40 to hold the first input 42, and hence a second IC pin 50 coupled to the current node 38, to $V_{REFN}$. A second current-mode analog-to-digital (A/D) converter 52 is coupled to the output 46 of the second operational amplifier to develop a second digital output signal representative of the current flowing through the second sensing current mirror 48. In certain example embodiments, the current node 20 is coupled to the IC pin 32 by an ESD resistor 58 and the current node 38 is coupled to the IC pin 50 by an ESD resistor 60 to resist electrostatic discharge.

In this non-limiting example, the A/D converter 34 employs thermometer encoding. It should be noted that the use of the word "thermometer" is not to imply that a measurement of temperature is taking place. Rather, as used herein, an A/D converter employing thermometer encoding is one generates a digital output encoded in a fashion that successive digital encodings resemble the movement of mercury in an old-fashioned thermometer. For example, for a n-bit digital output signal where n=2, the possible digital signals are 11, 10 and 00. For n=3, the possible digital signals are 111, 110, 100 and 000 and for n=4, the possible digital signals are 1111, 1110, 1100, 1000 and 0000. Therefore, the digital output of an n-bit A/D converter employing thermometer encoding as described herein is not a binary output but, rather a digitally encoded signal with n+1 possible values.

In this non-limiting example, A/D converter 34 includes a parallel connection of a plurality of current trip sensors 62A, 62B, 62C and 62D. Each of the current trip sensors include a converter current mirror 64A, 64B, 64C and 64D, respectively, coupled to the reference current source, the voltage source Vcc and to a digital node 66A, 66B, 66C, and 66D, respectively. Each converter current mirror defines a different trip point. In this non-limiting example, mirror 66A has a trip point of 2 μA, mirror 66B has a trip point of 6 μA, mirror 66C has a trip point of 12 μA, and mirror 66D has a trip point of 40 μA.

Each trip sensor 62A, 62B, 62C and 62D also includes a sensed current mirror 68A, 68B, 68C, and 68D, respectively, coupled to the output 28 of the operational amplifier 22, to their respective digital nodes 66A, 66B, 66C, and 66D, and to ground. A voltage level at a digital node is either a logical "1" or "0" dependent upon the trip point set by the converter current mirror, thereby creating the digital output signal at the digital nodes 66A, 66B, 66C, and 66D. It should be noted that the least significant bit (LSB) is on the left in this figure, and the most significant bit (MSB) is on the right. Therefore, when writing out the digital output signal 72, it is conventional to write the value of the nodes in reverse order, e.g. 66D, 66C, 66B, 66A.

First line fault detector 34, in this non-limiting example, also includes logic 70 coupled to the digital nodes 66A, 66B, 66C, and 66D of by a bus comprising the digital output signal 72. The logic 70 interprets the digital output signal 72 to determine a plurality of states of transmission line TRANS1 coupled to IC pin 32. For example, the various codes of digital output signal can include normal, short-to-ground, short-to-battery and open.

The structure and operation of second line fault detector 14 is similar to the operation of first line fault detector 12 and will therefore not be repeated herein for the sake of brevity. However, the second reference current mirror 36 is operated at a different current level than the first reference current mirror 18, and the trip points of the converter current mirrors of the A/D converters are also different, thereby differentiating the first digital output signal from a second digital output signal 73, which is in reverse order from the first digital signal 72. The output of logic 74 can be analyzed in conjunction with the output of logic 70 to determine if there is a short between the wires of the differential pair as well as the other aforementioned operating states.

It will therefore be appreciated that the current sending fault detector system works well with both coaxial transmission lines and twisted pair transmission lines. With coaxial transmission lines, only one of the two line fault detectors needs to be used or, alternatively, two separate coaxial transmission lines can be used. With twisted pair transmission lines, one of the lines is coupled to IC pin 32 and the other is coupled to IC pin 50. In this configuration, a number of operating states can be determined, including normal, short-to-ground, short-to-battery, shorted-differential-pair, and open.

An example operation of the current sensing fault detector system with a coaxial cable transmission line TRANS1 coupled to IC pin 32 follows. In this example embodiments, the first reference current mirror 18 drives a 20 uA current to current node 20, which then splits between the IC pin 32 and the first sensing current mirror 30. The negative feedback configured operational amplifier 22 holds the voltage on the IC pin 32 to about the reference voltage $V_{REFP}$, or about 1.25 volts DC, in this example. The amount of current $I_{SENSEP}$ following through the first sensing current mirror 30 will be $I_{SENSEP}$=20 uA$-I_P$=20 uA$-(V_{LINEP}-V_{REF})/(R_{EXT}+R_{ESD})$. In this example, $V_{LINE} \approx V_{REF}/2$ under normal conditions. When the line is open, shorted-to-battery, shorted-to-ground, or shorted-differential-pair, this relationship will vary and $I_{SENSEP}$ can be used to determine the nature of the fault.

A normal condition will have a current $I_P=V_{REFP}/(R_{EXT1}+R_{PD1}+R_{ESD})$. The sense current is thus $I_{SENSP}$=20 uA−Ip. An internal ESD resistor of, for example, 1.4k ohms is preferred, in some embodiments, not only for the dissipation of electrostatic discharge (ESD) but also to isolate the internal feedback loop from external capacitance. The sense current in first sensing current mirror 30 is mirrored into the sensed current mirrors 68A-68D. If the current at a sensed current mirror 68A-68D is less than the trip level, the associated digital node 66A-66D will be "1", otherwise the associated digital node 66A-66D will be "0". The combination of the digital nodes form a 4-bit thermometer digital code, e.g. the digital output signal of the current example. The logic circuit 70 can, for example, convert the 4-bit code to a 3-bit binary code to encode a plurality of distinct conditions to, for example, a status register.

The following are example conditions or "states" of this non-limiting example:
  Short to Ground—Vlinep=0, Ip wants to be 1.25/(1.4k+48.7k)=24.95 uA, more than the available 20 uA, so the operational amplifier 22 drives the current source 30 gate as low as it can collapsing the loop, Isensp=0, and none of the current detectors trip, and the thermometer code output=1111
  Normal Operation: Ip=1.25/(1.4k+48.7k+49.9k)=12.5 uA. Isensep=20 uA−12.5 uA=7.5 uA, tripping both the 2 uA and 6 uA detector setting the thermometer code to 1100.
  Line Open: When the transmission line is open, there is no external resistance and hence all of the 20 uA current drives into the current source 30 and 3 of the 4 detectors will trip yielding a thermometer code of 1000.

Short to Battery: Vlinep goes to 12V (or higher in electric cars with larger battery voltages) and Ip becomes negative, sinking external current into the part. Ip=(12−1.25)/(48.7+1.4)=−210 uA. Isensep=230 uA tripping all 4 detectors yielding a thermometer code of 0000.

The second line fault detector 14 operates similarly but with a 10 uA source current and a 0.75V reference in this non-limiting example. The detector thresholds are set similarly but with the different currents specific for the different source current and reference voltage but can detect the same four conditions or states as the first line fault detector 12, though in a different order. By having different currents and voltages in the two circuits, the line-to-line condition where the two wires of the twisted pair transmission line short together yield Isense currents producing a 1110 code. For the specific circuit implementation shown, the line-to-line short condition falls between the normal and open condition. Though the ordering of the thermometer code for the negative detector is different from that of the first fault line detector, there is 1:1 mapping of detector currents to fault conditions that detects five unique conditions including the new "Shorted-Differential-Pair" condition or state in addition to the four conditions or states described previously.

Figure 2:
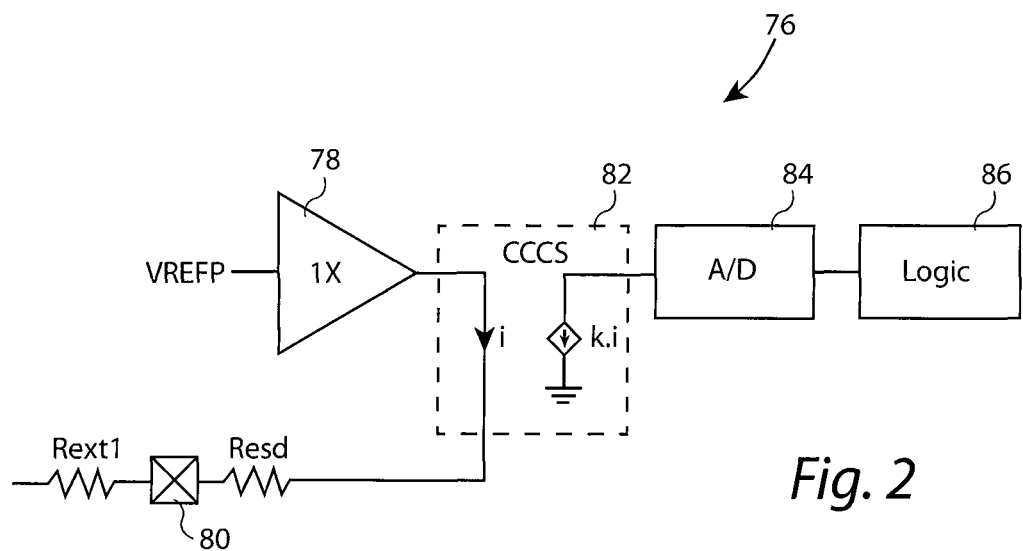
FIG. 2 is a block diagram of a second example current sensing line fault detector.

In FIG. 2, an alternative example current sensing line fault detector 76 includes a unity-gain buffer 78 having, as an input, a reference voltage VREFP to bias an integrated circuit (IC) pin 80 to VREFP volts via a low resistance electrostatic discharge protection resistor Resd. This advantageously provides voltage clipping at the IC pin 80 of a line voltage applied via an external resistor Rext1. It should be noted that, in this embodiment, the buffer current i is the same as the IC pin 80 current. A current controlled current source (CCCS) 82 having a gain k outputs a proportional current k*i which is measured by a current mode analog-to-digital (A/D) converter 84 and processed by logic circuitry 86 to detect various line fault conditions, as described above. While this example was described as a P side current sensing line fault detector, similar circuitry can be used for an N side current sensing line fault detector using a reference voltage VREFN. It should be noted that the unity gain buffer and a current controlled source portion of the circuit comprise a particular design of current conveyor, and other designs of current conveyors are known to those of skill in the art.

Figure 3:
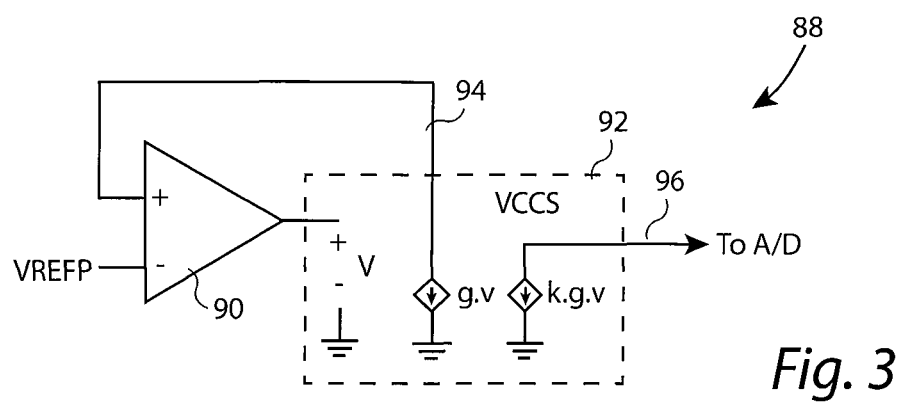
FIG. 3 is an example current conveyor of a current sensing line fault detector.

In FIG. 3, an example current conveyor 88 of a current sensing line fault detector includes an operational amplifier (OPAMP) 90 and a voltage controlled current source (VCCS) 92 having a first output 94 and a second output 96. First output 94 of VCCS 92 is fed back to the positive input of OPAMP 90 and second output 96 outputs a proportional current to an analog-to-digital (A/D) converter. The feedback provided by first output 94 maintains an IC pin voltage at the same level as a reference voltage, VREFP, at the negative input of OPAMP 90. The current flowing to the IC pin is measured by the proportional current of second output 96 of the VCCS. While it will be appreciated that a VCCS can take a number of designs, it can be as simple as a single transistor as illustrated in FIG. 1 by current mirror (VCCS) 30.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A current sensing line fault detector comprising:
   an operational amplifier (OPAMP) having a first input coupled to an input node and to a reference current source and having a second input coupled to a reference voltage source;
   a voltage controlled current source (VCCS) coupled between the first input and ground and feedback controlled by an output of the OPAMP to maintain the first input at the reference voltage level; and
   an analog-to-digital (A/D) converter coupled to the output of the OPAMP to develop a digital output signal representative of the current flowing through the VCCS;
   wherein the output of the VCCS is coupled to an integrated circuit (IC) pin, whereby the digital output signal is also representative to the current flowing through the IC pin.

2. A current sensing line fault detector as recited in claim 1 wherein the line fault detector is a positive (P) line circuit.

3. A current sensing line fault detector as recited in claim 1 wherein the line fault detector is a negative (N) line circuit.

4. A current sensing line fault detector as recited in claim 1 further comprising logic coupled to the digital output signal of the A/D converter.

5. A current sensing line fault detector as recited in claim 4 wherein the logic can interpret the digital output signal to determine a plurality of states of a transmission line coupled to the IC pin.

6. A current sensing line fault detector as recited in claim 5 wherein the plurality of states include normal, short-to-ground, short-to-battery, and open.

7. A current sensing differential pair line fault detector comprising:
   a positive (P) line fault detector including,
      a first operational amplifier having a first input coupled to a first differential input node and to a reference current source and having a second input coupled to a first reference voltage source,
      a first voltage controlled current source coupled between the first input and ground and feedback controlled by an output of the first operational amplifier to maintain the first input at the first reference voltage level; and
      a first analog-to-digital (A/D) converter coupled to the output of the first operational amplifier to develop a digital output signal representative of the current flowing through the first voltage controlled current source; and
   a negative (N) line fault detector including,
      a second operational amplifier having a first input coupled to a second differential input node and to a reference current source and having a second input coupled to a second reference voltage source,
      a second voltage controlled current source coupled between the first input and ground and feedback controlled by an output of the second operational amplifier to maintain the first input at the second reference voltage level; and a second analog-to-digital (A/D) converter coupled to the output of the second operational amplifier to develop a digital output signal representative of the current flowing through the second voltage controlled current source.

8. A current sensing differential pair line fault detector as recited in claim 7 further comprising first logic coupled to the digital output signal of the first A/D converter and second logic coupled to the digital output signal of the second A/D converter.

9. A current sensing differential pair line fault detector as recited in claim 8 wherein the first logic and the second logic can determine a plurality of states of a transmission line coupled to the IC pin.

10. A current sensing differential pair line fault detector as recited in claim 9 wherein the plurality of states include normal, short-to-ground, short-to-battery, shorted-differential-pair, and open.

11. A current sensing line fault detector comprising:
a reference current source coupled between a voltage source and ground;
a reference current mirror coupled to the reference current source, the reference current mirror coupled to the voltage source and having a current node;
an operational amplifier having a first input coupled to the current node, a second input coupled to a reference voltage, and an output;
a sensing current mirror coupled to the output of the operational amplifier and coupled between the current node and ground;
an integrated circuit (IC) pin coupled to the current node; and
an analog-to-digital (A/D) converter coupled to the output of the operational amplifier to develop a digital output signal representative of the current flowing through the sensing current mirror.

12. A current sensing line fault detector as recited in claim 11 wherein the line fault detector is one of a positive (P) line circuit and a negative (N) line circuit.

13. A current sensing line fault detector as recited in claim 11 wherein the A/D converter employs thermometer encoding.

14. A current sensing line fault detector as recited in claim 13 wherein the A/D converter comprises a parallel connection of a plurality of current trip sensors.

15. A current sensing line fault detector as recited in claim 14 where each trip sensor includes a converter current mirror coupled to the reference current source, to the voltage source, and to a digital node.

16. A current sensing line fault detector as recited in claim 15 wherein each converter current mirror defines a different trip point.

17. A current sensing line fault detector as recited in claim 16 wherein each trip sensor includes a sensed current mirror coupled to the output of the operational amplifier, to the digital node and to ground, whereby a voltage level at the digital node is either a logical "1" or "0" dependent upon the trip point set by the converter current mirror, thereby creating the digital output signal.

18. A current sensing line fault detector as recited in claim 17 wherein the A/D converter includes two current trip sensors and the digital output signal is one of 11, 10 and 00.

19. A current sensing line fault detector as recited in claim 17 wherein the A/D converter includes three current trip sensors and the digital output signal is one of 111, 110, 100 and 000.

20. A current sensing line fault detector as recited in claim 17 wherein the A/D converter includes four current trip sensors and the digital output signal is one of 1111, 1110, 1100, 1000 and 0000.

21. A current sensing line fault detector as recited in claim 17 further comprising logic coupled to each of the digital nodes of the converter current mirrors to interpret the digital output signal.

22. A current sensing line fault detector as recited in claim 21 wherein the logic can interpret the digital output signal to determine a plurality of states of a transmission line coupled to the IC pin.

23. A current sensing line fault detector as recited in claim 22 wherein the plurality of states include normal, short-to-ground, short-to-battery, and open.

* * * * *